United States Patent
Ohmi et al.

(10) Patent No.: US 8,496,792 B2
(45) Date of Patent: Jul. 30, 2013

(54) ROTARY MAGNET SPUTTERING APPARATUS

(75) Inventors: Tadahiro Ohmi, Sendai (JP); Tetsuya Goto, Sendai (JP); Takaaki Matsuoka, Tokyo (JP)

(73) Assignees: National University Corporation Tohoku University, Sendai-Shi (JP); Tokyo Electron Limited, Tokyo (JP)

( * ) Notice: Subject to any disclaimer, the term of this patent is extended or adjusted under 35 U.S.C. 154(b) by 683 days.

(21) Appl. No.: 12/593,660

(22) PCT Filed: Mar. 28, 2008

(86) PCT No.: PCT/JP2008/056139
§ 371 (c)(1),
(2), (4) Date: Sep. 29, 2009

(87) PCT Pub. No.: WO2008/123434
PCT Pub. Date: Oct. 16, 2008

(65) Prior Publication Data
US 2010/0126852 A1    May 27, 2010

(30) Foreign Application Priority Data

Mar. 30, 2007  (JP) ................................. 2007-092058

(51) Int. Cl.
*C23C 14/35* (2006.01)
(52) U.S. Cl.
USPC .............. 204/298.2; 204/298.12; 204/298.16; 204/298.17; 204/298.19; 204/298.11
(58) Field of Classification Search
USPC ............. 204/298.12, 298.16, 298.17, 298.19, 204/298.2, 298.11
See application file for complete search history.

(56) References Cited

U.S. PATENT DOCUMENTS

| | | | | |
|---|---|---|---|---|
| 4,194,962 A | * | 3/1980 | Chambers et al. | 204/298.23 |
| 4,946,576 A | * | 8/1990 | Dietrich et al. | 204/298.06 |
| 6,093,293 A | * | 7/2000 | Haag et al. | 204/298.12 |
| 6,251,242 B1 | * | 6/2001 | Fu et al. | 204/298.19 |
| 2004/0144638 A1 | * | 7/2004 | Jaso | 204/192.13 |
| 2005/0133365 A1 | * | 6/2005 | Hong et al. | 204/298.2 |
| 2007/0175748 A1 | * | 8/2007 | Atamny et al. | 204/192.1 |

FOREIGN PATENT DOCUMENTS

| | | | |
|---|---|---|---|
| EP | 1953257 A1 | | 8/2008 |
| JP | 63290270 A | * | 11/1988 |
| JP | 63307270 A | | 12/1988 |
| JP | 5148642 A | | 6/1993 |
| JP | 10-026698 A | | 1/1998 |
| JP | 2000-309867 A | | 11/2000 |
| JP | 2001-032067 A | | 2/2001 |
| JP | 3566327 B2 | | 6/2004 |
| KR | 20060004956 A | | 1/2006 |
| WO | 2007-043476 A1 | | 4/2007 |

OTHER PUBLICATIONS

International Search Report for PCT/JP2008/056139, dated Jul. 1, 2008.

(Continued)

*Primary Examiner* — Keith Hendricks
*Assistant Examiner* — Jason M Berman
(74) *Attorney, Agent, or Firm* — Pearne & Gordon LLP

(57) ABSTRACT

In a rotary magnet sputtering apparatus, a target consumption displacement quantity is measured, and corresponding to the measurement results, a distance between a rotating magnet group and a target is adjusted, and uniform film forming rate is achieved over a long period of time so as to reduce the change of a target surface due to consumption of the target and to reduce the change of the film forming rate with time. An ultrasonic sensor or a laser transmitting/receiving device may be used as a means for measuring the consumption displacement quantity of the target.

17 Claims, 11 Drawing Sheets

OTHER PUBLICATIONS

Itagaki et al, "Ogata Kiban'yo Spatter Sochi ni Okeru Multi Magnet Cathode (MMC) no Tokucho", Canon Anelva Technical Reports, May 2006, vol. 12, pp. 29-32.

Korean Office action for 10-2009-7021033 dated Jun. 22, 2011.
Korean Office action for 10-2009-7021033 dated Feb. 3, 2012.

* cited by examiner

1. No magnetic circuit is formed.
2. A paramagnetic member (relative magnetic permeability 100) is provided under a fixed outer peripheral magnetic shell.
3. A magnetic circuit is formed between a paramagnetic member under a fixed outer peripheral magnetic shell and a columnar rotary shaft.

ROTARY MAGNET SPUTTERING APPARATUS

TECHNICAL FIELD

This invention relates to a magnetron sputtering apparatus being a processing apparatus for applying predetermined surface treatment to a processing object such as a liquid crystal display substrate or a semiconductor substrate.

BACKGROUND ART

In the manufacture of a liquid crystal display element, a semiconductor element such as an IC, or the like, a thin film forming process is indispensably necessary so as to form a thin film of a metal, an insulating material, or the like on a substrate thereof. In this process, a film forming method is often performed by a sputtering apparatus that uses a raw material for thin film formation as a target, converts an argon gas or the like into a plasma by DC high voltage or high-frequency power, and activates the target by the plasma-converted gas so that the target is melted and dispersed to be coated on a substrate to be processed.

Such a sputtering film forming method tends to be mainly directed to a film forming method which uses a magnetron sputtering apparatus in order to raise the film forming rate. Specifically, the magnetron sputtering apparatus has magnets disposed on the back side of a target to generate the lines of magnetic force parallel to a target surface and to thereby confine plasma to the target surface to obtain high-density plasma.

FIG. 11 is a diagram for explaining the structure of the main part of a magnetron sputtering apparatus according to the prior art described above, wherein 101 denotes a target, 102 a substrate to be formed with a thin film, 103 a plurality of magnets, 104 lines of magnetic force, and 105 regions where the target 101 is melted and separated, i.e. erosion regions.

As shown in FIG. 11, the plurality of magnets 103 are disposed on the back side of the target 101 with their N-poles and S-poles oriented in predetermined directions, respectively, and the high-frequency power (RF power) 106 or the DC high-voltage power 107 is applied between the target 101 and the substrate 102 to excite a plasma on the target 101.

On the other hand, around the plurality of magnets 103 disposed on the back side of the target 101, the lines of magnetic force 104 are generated toward the S-poles from the adjacent N-poles. At a position where a vertical magnetic field (magnetic force line components perpendicular to a target surface) is zero on a target surface, a horizontal magnetic field (magnetic force line components parallel to the target surface) becomes locally maximum. In a region where the amount of horizontal magnetic field components is large, electrons are captured near the target surface to form high-density plasma, and thus, the erosion region 105 is formed at this position centered.

Since the erosion regions 105 are each exposed to high-density plasma as compared with the other regions, the target 101 is intensively consumed. When the film formation is continued so that the target material is used up in these regions, it is necessary to replace the entire target. As a result, the utilization efficiency of the target 101 becomes low and further there is a tendency that, with respect also to the thickness of a thin film on the substrate 102 disposed facing the target 101, the film thickness at positions facing the erosion regions 105 becomes greater so that the film thickness uniformity over the entire substrate 102 is deteriorated.

Further, since the erosion regions 105 are consumed, the distance between the target surface in the erosion regions and the magnets 103 becomes near as the consumption proceeds. Since the magnetic field strength becomes strong as the distance to the magnets becomes short, plasma with a higher density is excited in the erosion regions as compared with that before the consumption of the target. Therefore, a problem takes place such that, during long-term use, the film forming rate changes with time and the utilization efficiency degrades due to further local target consumption.

In order to suppress the time-dependent change in film forming rate, it is effective to move the magnets 103 away from the initial surface of the target depending on the consumption of the target (Non-Patent Document 1). However, when the consumption of the target is nonuniform, even if the distance between the magnets 103 and the initial surface of the target is increased by an amount corresponding to the consumption of the erosion regions, the magnetic field strength distribution on the surface of the target after the consumption differs from the initial magnetic field strength distribution even in the erosion regions because these regions are consumed in a smooth concave shape. Therefore, it is necessary to uniformly consume the target for suppressing the time-dependent change in film forming rate.

In view of this, there have conventionally been proposed techniques of using bar magnets as magnets for generating magnetic fields and moving erosion regions with time by moving or rotating the bar magnets, thereby substantially preventing local consumption of a target on the time average and further improving the film thickness uniformity of a substrate (see Patent Documents 1 to 3).

Non-Patent Document 1: Canon ANELVA Technical Report vol. 12 (pp. 29-32)
Patent Document 1: JP-A-H5-148642
Patent Document 2: JP-A-2000-309867
Patent Document 3: JP-B-3566327

DISCLOSURE OF THE INVENTION

Problem to be Solved by the Invention

In the above-mentioned conventional techniques, however, if an attempt is made to increase the moment-to-moment erosion densities, i.e. to increase the ratio of the erosion regions with respect to the entire target region, for increasing the rate of film formation on the substrate, it is necessary to enhance the strength of the bar magnets and further to cause the compact bar magnets to approximate each other. However, if such a structure is employed, there has been a problem that the magnets or fixing rods are deformed due to repulsion or attraction between the magnets or it becomes difficult to carry out movement or rotation against such a force.

Further, when the rotatable magnets rotate with the bar magnets fixed and located adjacent to the bar magnets, the same phase inevitably appears between the magnetic poles of the rotatable magnets and the magnetic poles of the fixed bar magnet. In this case, no closed erosion loop is formed.

Therefore, this invention has been made in view of the above-mentioned conventional problems and has an object to provide a rotary magnet sputtering apparatus that improves the film forming rate by increasing the moment-to-moment erosion densities on a target.

Further, it is another object of this invention to provide a rotary magnet sputtering apparatus that prolongs the life of a target by moving an erosion region with time to prevent local wear of the target, thereby realizing uniform consumption thereof.

Further, it is another object of this invention to provide a rotary magnet sputtering apparatus that suppresses a time-dependent change in magnetic field strength distribution on a surface of a target, thereby suppressing a time-dependent change in film forming rate in long-term operation.

Means for Solving the Problem

According to a first aspect of this invention, there is provided a rotary magnet sputtering apparatus comprising a substrate holder for holding a substrate to be processed, a target facing the substrate, and a magnet disposed on a side of the target opposite to the substrate, and adapted to confine plasma on a target surface by forming a magnetic field on the target surface using the magnet, wherein the magnet comprises a rotary magnet group having a plurality of plate-like magnets arranged on a columnar rotary shaft and a fixed outer circumferential frame magnet which is arranged in parallel with the target surface around the rotary magnet group and which is magnetized in a direction perpendicular to the target surface; a magnetic field pattern on the target surface moves with time by rotating the rotary magnet group along with the columnar rotary shaft; and the rotary magnet sputtering apparatus comprises means for measuring a consumption amount of the target, i.e. a consumption displacement amount of the target, and has a function of moving the columnar rotary shaft, the rotary magnet group, and the fixed outer circumferential frame magnet away from the target by a distance equal to the consumption displacement amount, thereby always maintaining constant a distance between the target surface and each of the columnar rotary shaft, the rotary magnet group, and the fixed outer circumferential frame magnet.

According to a second aspect of this invention, there is provided a rotary magnet sputtering apparatus according to the first aspect, wherein the means for measuring the consumption displacement amount of the target comprises an ultrasonic transducer attached to a rotary magnet group side of the target to perform the measurement on the basis of a reflection property of ultrasonic radiation.

According to a third aspect of this invention, there is provided a rotary magnet sputtering apparatus according to the first aspect, wherein the means for measuring the consumption displacement amount of the target performs the measurement by entering light from a fixed position on a plasma exciting side of the target and by measuring an amount of change in angle of reflected light at another fixed position.

According to a fourth aspect of this invention, there is provided a rotary magnet sputtering apparatus according to the second or the third aspect, wherein the means for measuring the consumption displacement amount of the target comprises a plurality of measurement units arranged in an axial direction of the columnar rotary shaft.

According to a fifth aspect of this invention, there is provided a rotary magnet sputtering apparatus according to any one of the first to the fourth aspects, wherein the rotary magnet group is helical plate-like magnet groups forming a plurality of helices by helically disposing the plate-like magnets on the columnar rotary shaft such that the helices adjacent to each other in the axial direction of the columnar rotary shaft form mutually different magnetic poles of N-poles and S-poles on an outer side in a diameter direction of the columnar rotary shaft; and the fixed outer circumferential frame magnet is, as seen from a target side, configured to surround the rotary magnet group and forms a magnetic pole of N-pole or S-pole on the target side.

According to a sixth aspect of this invention, there is provided a rotary magnet sputtering apparatus according to any one of the first to the fifth aspects, wherein at least part of the columnar rotary shaft is a paramagnetic substance.

According to a seventh aspect of this invention, there is provided a rotary magnet sputtering apparatus according to any one of the first to the fourth aspects, wherein a fixed outer peripheral paramagnetic member is disposed adjacent to the fixed outer circumferential frame magnet on an opposite side of the fixed outer circumferential frame magnet relative to the target.

According to an eighth aspect of this invention, there is provided a rotary magnet sputtering apparatus according to any one of the first to the seventh aspects, further comprising means for weakening magnetic flux directed toward an outer side of the target from the fixed outer circumferential frame magnet in comparison with magnetic flux directed toward an inner side of the target from the fixed outer circumferential frame magnet.

According to a ninth aspect of this invention, there is provided a rotary magnet sputtering apparatus according to the eighth aspect, wherein the means comprises a paramagnetic member arranged to continuously cover, among surfaces of the fixed outer circumferential frame magnet, the side surface on an outer side as seen from the target side and part of the surface on the target side.

According to a tenth aspect of this invention, there is provided a rotary magnet sputtering apparatus according to the eighth or the ninth aspect, wherein the means is configured by the fixed outer circumferential frame magnet such that, among surfaces of the fixed outer circumferential frame magnet, the surface on the target side is projected toward the inner side of the target.

According to an eleventh aspect of this invention, there is provided a rotary magnet sputtering apparatus according to any one of the first to the tenth aspects, wherein a shielding member is provided and the shielding member extends in a direction the same as the axial direction of the columnar rotary shaft and forms a slit opening the target to the substrate and a width and a length of the slit are set so that, when the rotary magnet group is rotated at a constant frequency, a region is opened as seen from the substrate, such that a magnetic field strength is 75% or more of a maximum value in a time average distribution of magnetic field strengths of components parallel to the target surface in a magnetic field formed on the target surface.

According to a twelfth aspect of this invention, there is provided a rotary magnet sputtering apparatus according to any one of the first to the tenth aspects, further comprising a shielding member disposed on a side opposite to the rotary magnet group so as to cover an end portion of the target and to be spaced apart from the target; the shielding member being electrically grounded, and extending in a direction the same as the axial direction of the columnar rotary shaft and forming therealong a slit opening the target to the substrate and a width and a length of the slit are set so that, when the substrate is fixed and the plate-like magnet group is rotated at a constant frequency, a region of the substrate is shielded such that a film thickness to be formed per unit time is 80% or less of a maximum film thickness to be formed on the substrate per unit time when the end portion of the target is not shielded.

According to a thirteenth aspect of this invention, there is provided a rotary magnet sputtering apparatus according to any one of the first to the twelfth aspects, wherein the rotary magnet group and the fixed outer circumferential frame magnet are movable in the direction perpendicular to the target surface.

According to a fourteenth aspect of this invention, there is provided a rotary magnet sputtering apparatus according to any one of the first to the thirteenth aspects, wherein the rotary magnet group and the fixed outer circumferential frame magnet are disposed in a space surrounded by the target member, a backing plate to which the target member is bonded, and a wall surface continuously extended from the periphery of the backing plate and the space can be reduced in pressure.

According to a fifteenth aspect of this invention, there is provided a rotary magnet sputtering apparatus according to any one of the first to the fourteenth aspects, comprising means for relatively moving the substrate in a direction crossing the axial direction of the columnar rotary shaft.

According to a sixteenth aspect of this invention, there is provided a rotary magnet sputtering apparatus comprising a plurality of rotary magnet sputtering apparatuses each of which is formed in accordance with any one of the first to the fifteenth aspects and which are disposed in parallel with the axial direction of the columnar rotary shaft, wherein there is provided means for relatively moving the substrate in a direction crossing the axial direction of the columnar rotary shaft.

According to a seventeenth aspect of this invention, there is provided a sputtering method which uses a rotary magnet sputtering apparatus according to any one of the first to the sixteenth aspects and which performs film deposition of a material of the target on a substrate to be processed while rotating the columnar rotary shaft.

According to an eighteenth aspect of this invention, there is provided an electronic device manufacturing method comprising a step of performing sputtering film formation on a substrate to be processed, using the sputtering method according to the seventeenth aspect.

According to a nineteenth aspect of this invention, there is provided a rotary magnet sputtering apparatus adapted to form a magnetic field on a surface of a target using a magnet and to move the magnetic field along a rotary shaft by rotating the magnet about the rotary shaft, thereby performing film formation onto a substrate to be processed, the rotary magnet sputtering apparatus comprising measuring means for measuring a consumption displacement amount of the target to obtain a measurement result and distance adjusting means for relatively changing a distance between the magnet and the substrate according to the measurement result.

According to a twentieth aspect of this invention, there is provided a rotary magnet sputtering apparatus according to the nineteenth aspect, wherein the measuring means for measuring comprises means for transmitting an ultrasonic wave to the target, means for receiving the ultrasonic wave reflected from the target, and means for calculating the consumption displacement amount of the target from the ultrasonic wave received and outputting it as the measurement result.

According to a twenty-first aspect of this invention, there is provided a rotary magnet sputtering apparatus according to the nineteenth aspect, wherein the measuring means comprises means for transmitting one of laser light, a millimeter wave, a submillimeter wave, a terahertz wave, and an infrared ray to the target, means for receiving reflected light or a reflected wave reflected from the target, and means for calculating the consumption displacement amount of the target using the reflected light or reflected wave received.

According to a twenty-second aspect of this invention, there is provided a rotary magnet sputtering apparatus according to any one of the nineteenth to the twenty-second aspects, wherein the measuring means is arranged at a plurality of portions in an axial direction of the rotary shaft.

According to a twenty-third aspect of this invention, there is provided a rotary magnet sputtering apparatus according to any one of the nineteenth to the twenty-second aspects, wherein the distance adjusting means comprises means for moving the rotary shaft with respect to the substrate according to the measurement result.

Effect of the Invention

According to this invention, it is possible to improve the film forming rate and to prolong the life of a target by preventing local wear of the target to realize uniform consumption thereof and, simultaneously, it is possible to realize an improvement in film forming rate reproducibility in long-term operation and an improvement in utilization efficiency of the target.

Figure 1:
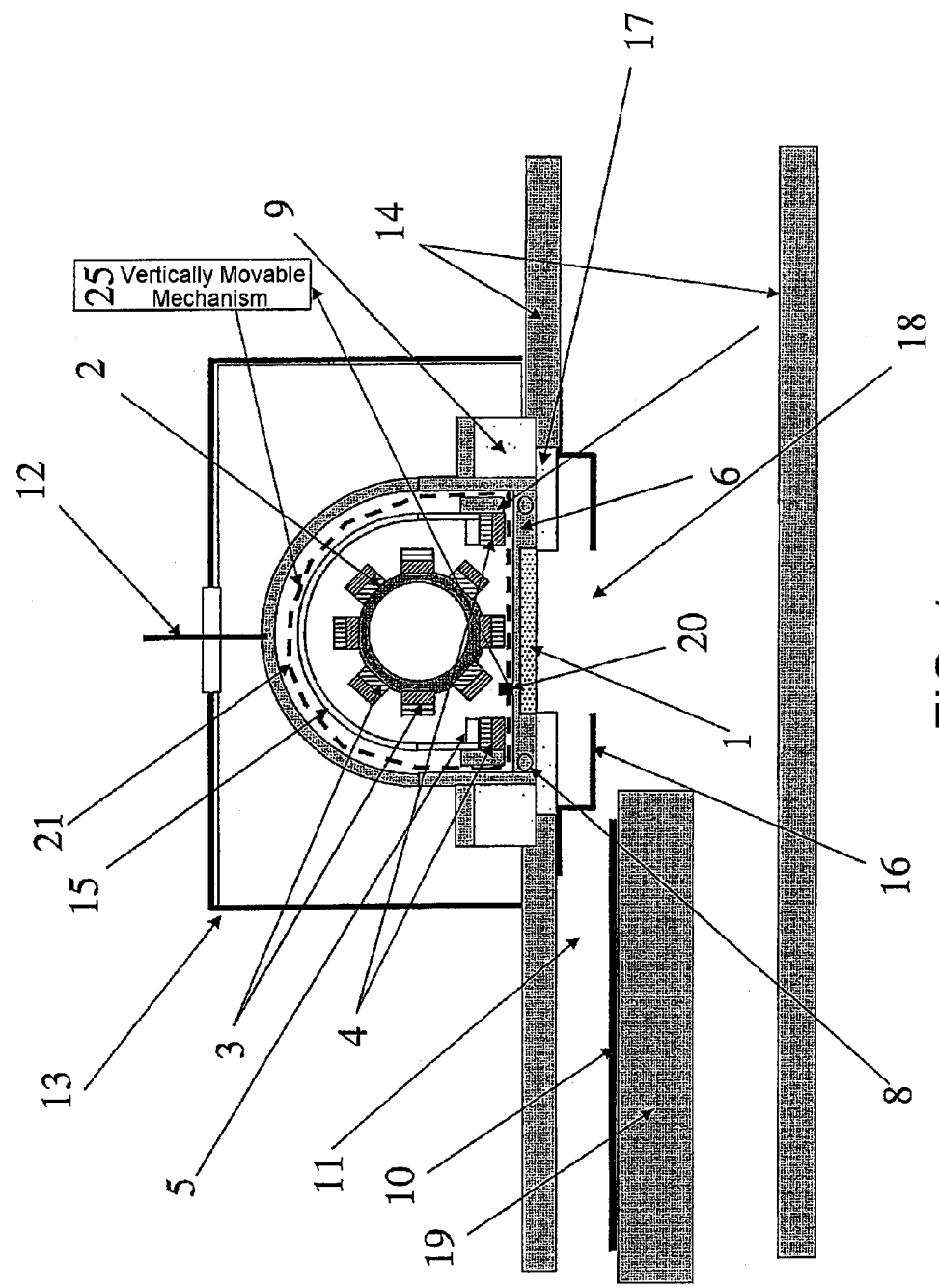
FIG. 1 is a schematic structural diagram showing a rotary magnet sputtering apparatus according to a first embodiment of this invention.

DESCRIPTION OF SYMBOLS 1 target
2 columnar rotary shaft
3 rotary magnet group
4 fixed outer circumferential frame magnet
5 outer peripheral paramagnetic member
6 backing plate
8 coolant passage
9 insulating member
10 substrate to be processed
11 process chamber space
12 feeder line
13 cover
14 outer wall
15 paramagnetic member
16 plasma shielding member
17 insulating member 19 placing stage
20 ultrasonic sensor
21 movable portion
25 vertically movable mechanism

BEST MODE FOR CARRYING OUT THE
INVENTION

Hereinbelow, embodiments of this invention will be described with reference to the drawings.

First Embodiment

A first embodiment of this invention will be described in detail with reference to the drawings.

FIG. 1 is a sectional view for explaining the structure of a rotary magnet sputtering apparatus according to the first embodiment of this invention.

In FIG. 1, 1 denotes a target of aluminum, 2 a columnar rotary shaft, 3 a plurality of helical plate-like magnet groups (i.e., rotary magnet groups) helically disposed on a surface of the rotary shaft 2, 4 a fixed outer circumferential frame magnet disposed at the outer periphery of the rotary magnet group 3, 5 an outer peripheral paramagnetic member disposed on the side opposite to the target and faced to the fixed outer circumferential frame magnet 4, 6 a backing plate of copper to which the target 1 is bonded, 15 a paramagnetic member configured to cover the columnar rotary shaft 2 and the helical plate-like magnet groups 3 at portions thereof other than on the target side, 8 a passage for passing a coolant therethrough, 9 an insulating member, 10 a substrate to be processed, 19 a placing stage for placing a substrate thereon, 11 a process chamber space, 12 a feeder line, 13 a cover electrically connected to a process chamber, 14 outer walls forming the process chamber, 16 a conductive plasma shielding member disposed on the outer wall 14 so as to be electrically connected thereto, and 17 an insulating member excellent in plasma resistance.

The illustrated plasma shielding member 16 forms a slit extending in an axial direction of the columnar rotary shaft 2 and opening the target 1 with respect to the substrate 10 to be processed. In this case, the width and the length of the slit of the plasma shielding member 16 are set so that when the rotary magnet group 3 is rotated at a constant frequency, a region is opened as seen from the substrate 10 such that a magnetic field strength is 75% or more of the maximum value in the time average distribution of magnetic field strengths of components parallel to a surface of the target 1 in a magnetic field formed on the surface of the target 1. Simultaneously, the width and the length of the slit are set so that a region of the substrate 10 where the film thickness to be formed per unit time is 80% or less of the maximum film thickness to be formed on the substrate 10 per unit time when the end portions of the target 1 are not shielded is shielded by the plasma shielding member 16. A region not shielded by the plasma shielding member 16 is a region where the magnetic field strength is high and thus plasma with a high density and a low electron temperature are generated so that there is no charge-up damage or ion irradiation damage to the substrate 10, and is simultaneously a region where the film forming rate is high. By shielding the region other than this region by the shielding member 16, it is possible to carry out film formation with no damage without substantially reducing the film forming rate.

On the other hand, a DC power supply, a RF power supply, and a matching device are connected to the feeder line 12. The plasma excitation power is supplied to the backing plate 6 and the target 1 from the DC power supply and the RF power supply through the matching device and further through the feeder line 12 and the housing so that plasma is excited on a surface of the target 1. Plasma can be excited only by the DC power or the RF power, but in terms of the film quality controllability and the film forming rate controllability, it is preferable to apply both. The frequency of the RF power is normally selected between several hundred kHz and several hundred MHz, but in terms of increasing the plasma density and reducing the plasma electron temperature, a high frequency is preferable. In this embodiment, it is set to 13.56 MHz. The plasma shielding member 16 also functions as a ground plate for the RF power. With this ground plate, even if the substrate 10 is in an electrically floating state, plasma can be efficiently excited. The paramagnetic member 15 has an effect of magnetic shielding of a magnetic field generated by the magnets and an effect of reducing a change in magnetic field due to disturbance near the target 1.

In the illustrated example, in order to measure the consumption amount of the target 1, an ultrasonic sensor 20 adapted to perform transmission/reception of an ultrasonic wave is disposed so as to transmit an ultrasonic wave toward the target 1. In this example, the consumption displacement amount of the target 1 is measured by attaching an ultrasonic transducer of the ultrasonic sensor 20, to the back side of the target 1, i.e. the helical plate-like magnet group 3 side of the backing plate 6, and by measuring an ultrasonic wave which is radiated from the ultrasonic transducer and which is then reflected from the surface of the target 1.

A region inside a dotted line, i.e. a region (movable portion) including the columnar rotary shaft 2, the rotary magnet group 3, the fixed outer circumferential frame magnet 4 disposed around the rotary magnet group 3, and the outer peripheral paramagnetic member 5, is movable upward and downward in the figure by an exemplarily illustrated vertically movable mechanism 25 including a motor. In response to a measurement result representing a consumption displacement amount of the target 1 measured by the ultrasonic sensor 20, the vertically movable mechanism 25 moves the above-mentioned region 21 in the direction perpendicular to the target 1.

Figure 2:
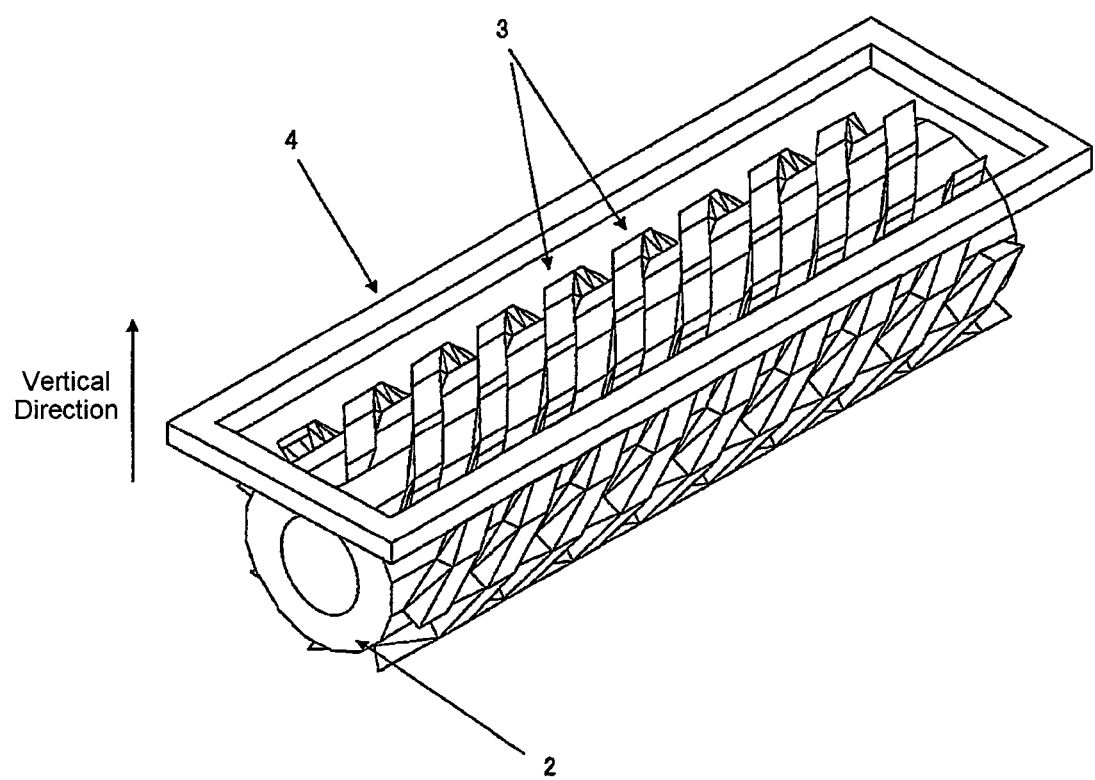
FIG. 2 is a perspective view for explaining in more detail a magnet portion of the rotary magnet sputtering apparatus shown in FIG. 1.

Referring to FIG. 2, a magnet portion will be described in more detail. FIG. 2 shows a perspective view of the columnar rotary shaft 2, the plurality of helical plate-like magnet groups 3, and the fixed outer circumferential frame magnet 4. Herein, the plurality of the helical plate-like magnet groups 3 form a rotary magnet group that rotates along with the rotation of the columnar rotary shaft 2.

A material of the columnar rotary shaft 2 may be an ordinary stainless steel or the like, but it is preferable that the columnar rotary shaft 2 be partly or entirely made of a paramagnetic substance with a low magnetic resistance such as, for example, a Ni—Fe-based high magnetic permeability alloy. In this embodiment, the columnar rotary shaft 2 is made of the Ni—Fe-based high magnetic permeability alloy. The columnar rotary shaft 2 can be rotated by a non-illustrated gear unit and motor.

The columnar rotary shaft 2 illustrated in the figure has a regular hexadecagonal cross-section with one side having a length of 16.7 mm. Many rhombic plate-like magnets are attached to respective faces to form the plurality of helical plate-like magnet groups 3. The columnar rotary shaft 2 is configured so as to be attached with the magnets on its outer periphery, can be easily made thick, and has a structure that is strong against bending due to magnetic forces applied by the magnets. In order to stably generate a strong magnetic field, each of the plate-like magnets forming the helical plate-like magnet groups 3 is preferably a magnet with a high residual magnetic flux density, a high coercive force, and a high energy product, such as, for example, a Sm—Co-based sintered magnet with a residual magnetic flux density of about 1.1 T or a Nd—Fe—B-based sintered magnet with a residual magnetic flux density of about 1.3 T.

In this embodiment, the Nd—Fe—B-based sintered magnet is used. The plate-like magnets of the helical plate-like magnet groups 3 are each magnetized in a direction perpendicular to its plate surface and are helically bonded to the columnar rotary shaft 2 to form a plurality of helices such that the helices adjacent to each other in an axial direction of the columnar rotary shaft form mutually different magnetic poles, i.e. N-poles and S-poles, on the outer side in a diameter direction of the columnar rotary shaft.

The fixed outer circumferential frame magnet 4 is, as seen from the target 1, configured to surround the rotary magnet group composed of the helical plate-like magnet groups 3 and is magnetized so that the target 1 side becomes an S-pole. A Nd—Fe—B-based sintered magnet is also used as the fixed outer circumferential frame magnet 4 for the same reason as for the plate-like magnets of the helical plate-like magnet groups 3.

Figure 3:
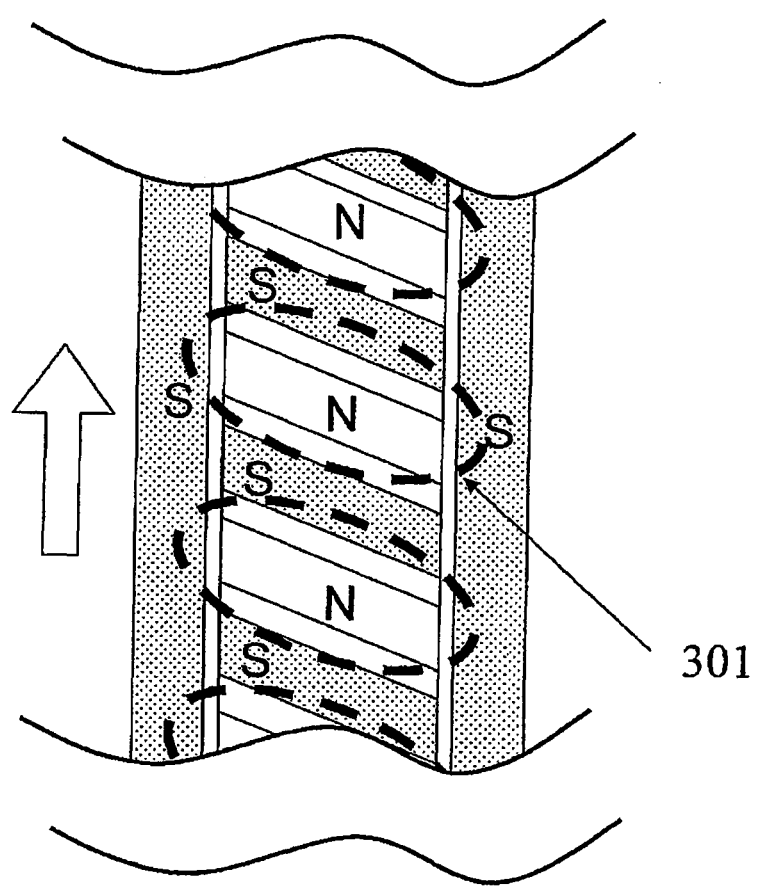
FIG. 3 is a diagram for explaining erosion formation in this invention.

Next, description will be made in detail with reference to FIG. 3 about erosion formation in this embodiment. Thus, the helical plate-like magnet groups 3 are formed by disposing the many plate-like magnets on the columnar rotary shaft 2, as mentioned before. When the helical plate-like magnet groups 3 are seen from the target 1 side, an arrangement is given such that S-poles of the plate-like magnet formed by the fixed outer circumferential frame magnet 4 and the plate-like magnets forming the helical plate-like magnet groups 3 approximately surround an N-pole of each of the plate-like magnets forming the other helical plate-like magnet groups 3. FIG. 3 is a conceptual diagram thereof. With this configuration, the lines of magnetic force generated from the N-poles of the plate-like magnets of the helical plate-like magnet groups 3 are terminated at the peripheral S-poles. As a result, many closed erosion regions 301 are formed on the surface of the target located at some distance from surfaces of the plate-like magnets. Further, by rotating the columnar rotary shaft 2, the many erosion regions 301 move along with the rotation. In FIG. 3, the erosion regions 301 move in a direction indicated by an arrow. At end portions of the rotary magnet group forming the helical plate-like magnet groups 3, the erosion regions 301 are sequentially generated from one of the end portions and sequentially extinguished at the other end portion.

In this embodiment, the columnar rotary shaft 2 has the regular hexadecagonal cross-section and the plate-like magnets are bonded to the respective faces. However, it may be configured that, in order to realize a smoother helical shape, the shape of the cross-section is set to a regular polygon with more vertices (e.g. a regular triacontadigon) and smaller plate-like magnets are bonded thereto or, as long as horizontal magnetic field loops are formed on the surface of the target, the shape of the cross-section is set to a polygon with less vertices (e.g. a regular octagon) for cost reduction. On the other hand, it may be configured that, in order to cause adjacent plate-like magnets, which form helices, to approximate each other, the shape of a cross-section of each plate-like magnet is set not to a rectangle but to a trapezoid with a larger outer side in the diameter direction of the rotary shaft.

Next, using FIG. 4, description will be given about an effect obtained by forming the columnar rotary shaft 2 of the paramagnetic substance.

Figure 4:
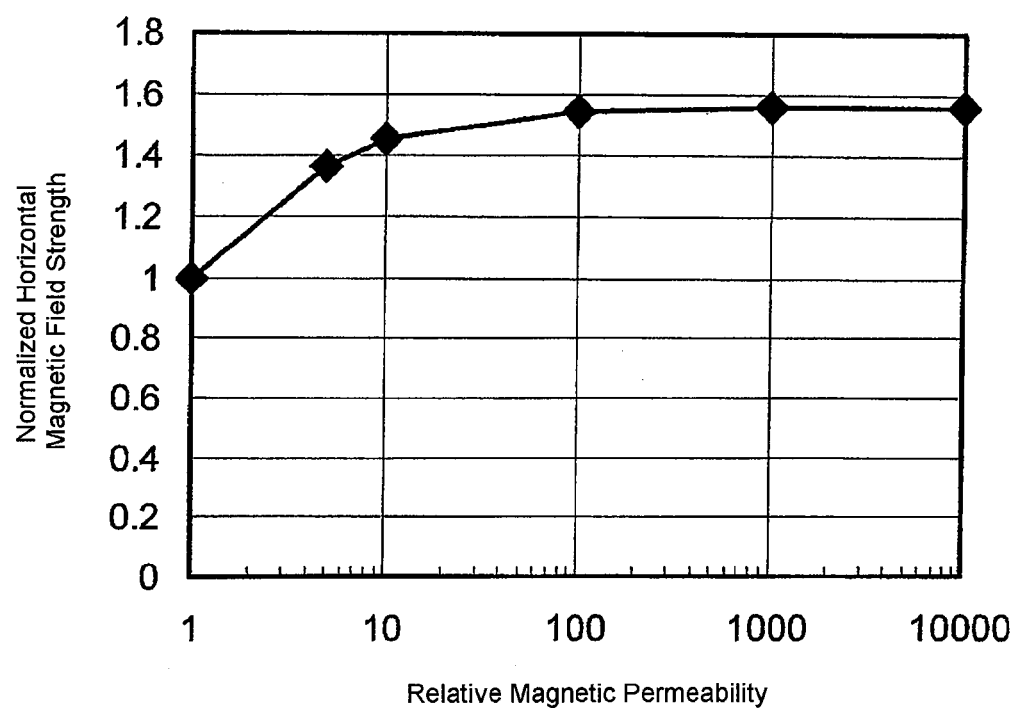
FIG. 4 is a graph showing the relationship between the relative magnetic permeability of a columnar rotary shaft used in the rotary magnet sputtering apparatus and the horizontal magnetic field strength.

In FIG. 4, the ordinate axis and the abscissa axis represent the horizontal magnetic field strength of the erosion region 301 and the relative magnetic permeability of the columnar rotary shaft 2, respectively, thereby showing the dependence of the horizontal magnetic field strength upon the relative magnetic permeability of the columnar rotary shaft 2. In FIG. 4, normalization is performed when the relative magnetic permeability is 1. From FIG. 4, it is seen that as the relative magnetic permeability of the columnar rotary shaft 2 increases, the horizontal magnetic field strength also increases and, in particular, when the relative magnetic permeability is 100 or more, a magnetic field strength could be increased by about 60%. This is because the magnetic resistances on the columnar rotary shaft side of the plate-like magnets forming the helical plate-like magnet groups 3 are reduced so that the lines of magnetic force can be efficiently generated toward the target 1 side. This makes it possible to improve the confining effect when plasma is excited, so that the plasma electron temperature decreases to reduce the damage to the substrate 10 and further the plasma density increases to improve the film forming rate.

Figure 5:
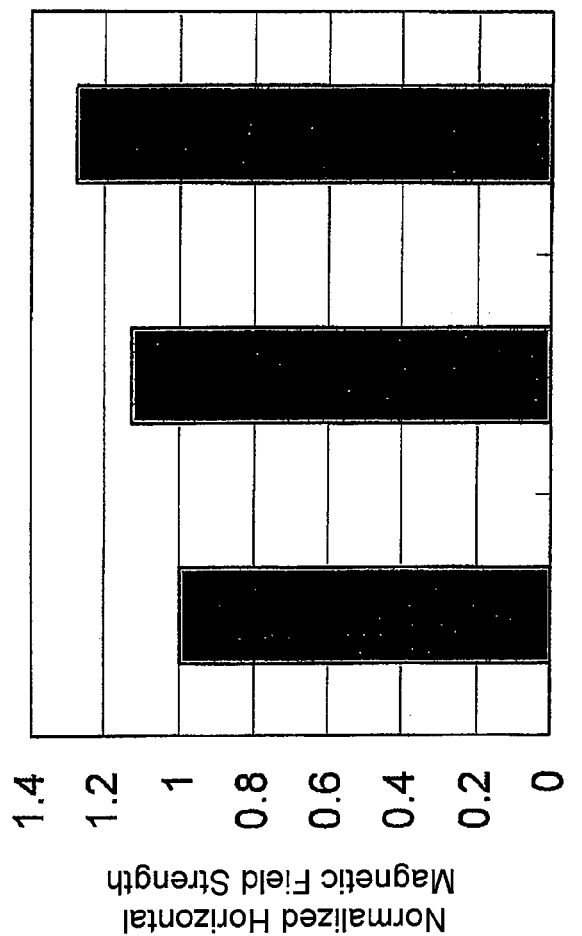
FIG. 5 is a graph for explaining a change in horizontal magnetic field strength when a fixed outer peripheral paramagnetic member, which forms a magnetic circuit with respect to a fixed outer circumferential frame magnet, is provided.

Further, as shown in FIG. 1, it is seen that when the fixed outer peripheral paramagnetic member 5 is provided under the fixed outer circumferential frame magnet 4, i.e., on the side opposite to the target 1 with respect to the fixed outer circumferential frame magnet 4, the horizontal magnetic field strength increases by about 10% as compared with the case where the fixed outer peripheral paramagnetic member 5 is not provided, as shown in FIG. 5, and, further, when part of the fixed outer peripheral paramagnetic member is extended to a portion adjacent to the columnar rotary shaft 2 and is adjoined to a magnetic body portion of the columnar rotary shaft 2 through a magnetic fluid to form a magnetic circuit with a low magnetic resistance between the rotary magnet group and the fixed outer circumferential frame magnet, the horizontal magnetic field strength increases by about 30%, so that the film forming performance is improved.

Figure 6:
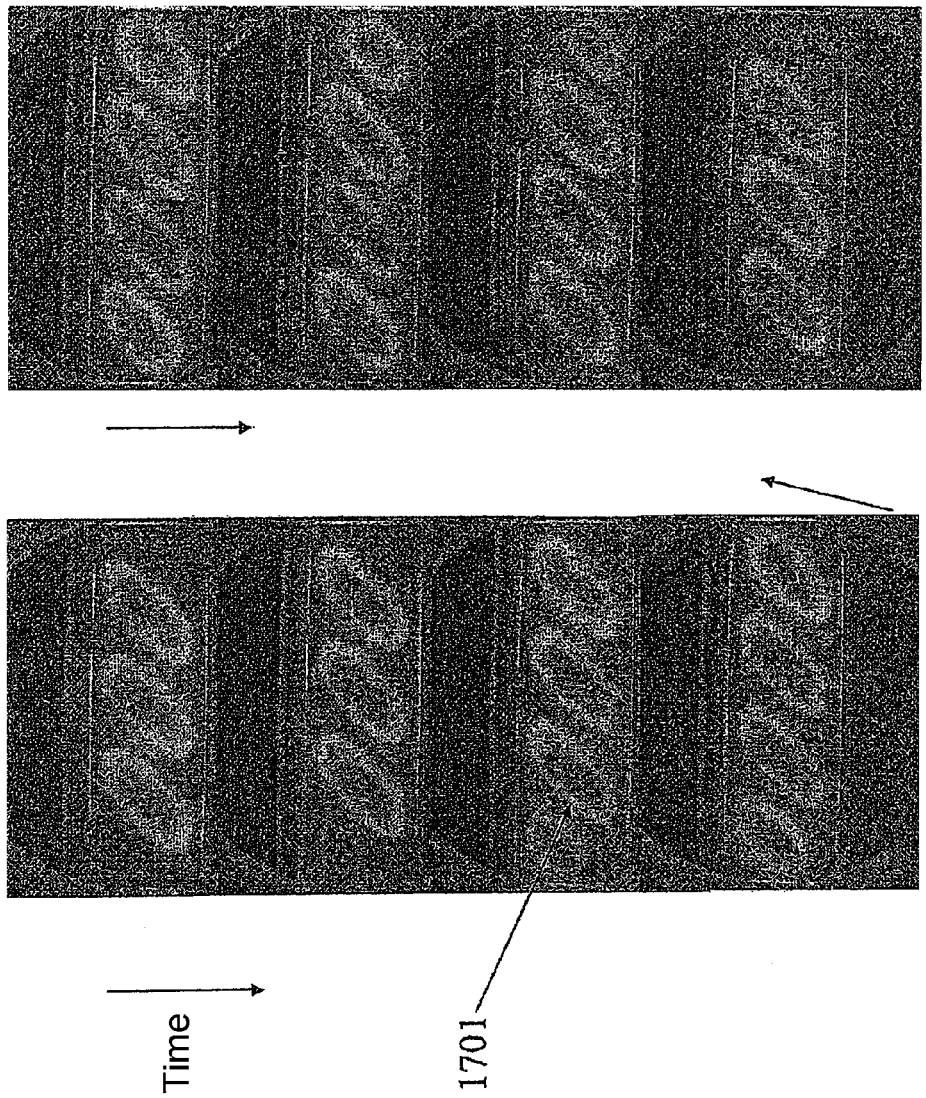
FIG. 6 is photographs showing time-dependent changes of plasma on a surface of a target.
Figure 7:
FIG. 7 is a photograph showing a consumption state of the target used for a long time.

In this embodiment, it is seen that the horizontal magnetic field strength of the erosion region 301 (FIG. 3), i.e. the magnetic field strength parallel to the target 1 surface, exceeds 500 gauss and thus there is obtained a strength sufficient for confining plasma. FIG. 6 shows photographs of time-dependent changes of plasma on the target surface. Plasma excitation conditions were such that an argon gas was introduced at 1000 cc per minute and a 13.56 MHz RF power of 800 W was applied. The columnar rotary shaft was rotated at 1 Hz. As seen from the photograph (showing a state of changes with time from upper to lower) on the left side of FIG. 6, a plasma loop 601 (erosion loop) is stably produced from the left end of the rotary shaft, then moves along with the rotation, and, as seen from the photograph (showing a state of changes with time from upper to lower) on the right side of FIG. 6, is stably extinguished from the right end of the rotary shaft. FIG. 7 shows a photograph of a consumption state of the target 1 after long-term discharge. From the figure, it is seen that the target surface is consumed not locally but uniformly.

In this embodiment, as described before, there is provided the ultrasonic sensor 20 having the function of transmitting an ultrasonic wave in the direction of the target 1 and receiving an ultrasonic wave from the direction of the target 1. In this example, an ultrasonic wave transmitted in the direction of the target 1 from the ultrasonic sensor 20 first propagates through the backing plate 6 to reach the interface between the backing plate 6 and the target 1 and then is partly reflected and partly propagates into the target 1. First, the component reflected here is received at the ultrasonic sensor 20, while, the component propagating into the target 1 reaches the surface on the process space 11 side of the target 1 and is reflected there and, after passing through the target 1 and the backing plate 6, is received at the ultrasonic sensor 20. That is, by measuring a time delay from the transmission of the ultrasonic wave to the arrival of the second reflection wave, it is possible to measure the thickness of the target 1. The backing plate 6 is made of copper and the target 1 is, in this example, made of aluminum, assuming that the propagation speeds of a sound wave in copper and aluminum are given by C1 and C2, respectively, and the thicknesses of the backing plate 6 and the aluminum target 1 are given by D1 and D2, respectively. Under the circumstances, a time t in which an ultrasonic wave is transmitted, reflected by the surface on the process chamber 11 side of the target 1, and returns again to an ultrasonic monitor is given by $t=2\times D1/C1+2\times D2/C2$. Therefore, the thickness D2 of the target 1 is expressed by the following formula (1).

$$D2=C2\times(t/2-D1/C1) \quad (1)$$

Herein, since D1 and C1 are known, the target thickness can be derived by measuring the time t.

In this embodiment, D1=10 mm and D2=5 mm before the film forming operation. C1 and C2 are values inherent to the physical properties and are 6400 m/s and 5000 m/s, respectively. Thus, $t=2.56\ \mu s$. Thereafter, in the course of the long-term film forming operation, $t=2.36\ \mu s$.

From the formula (1), it is seen that the thickness D2 of the target 1 in this event is 4 mm and thus the target 1 is consumed by 1 mm. Since the distance between the target surface and the magnets is reduced by 1 mm, the magnetic field strength increases by about 20% and thus the film forming rate also increases correspondingly.

In view of this, the magnet group and the magnetic members in the dotted line region (movable portion) 21 shown in FIG. 1 are moved away from the target 1 in the vertical direction by 1 mm and then the film forming rate is returned back to be substantially equal to that at the start of the operation. By repeating such an operation, it is possible to perform the long-term operation without changing the film forming rate until the target 1 is substantially all consumed and it is possible to prevent unnecessary thick film formation from being carried out over a long-term period and thus to suppress wasteful use of the material of the target 1.

Although the distance of moving the magnets is set to a target consumption of 1 mm in this embodiment, it is not limited to this value. Further, since the propagation speed of an ultrasonic wave is a value inherent to a substance, the consumption displacement amount measuring method according to this embodiment is also applicable to an arbitrary material of the target or the backing plate.

Second Embodiment

A second embodiment of this invention will be described in detail with reference to FIG. 8. A description of portions overlapping those in the above-mentioned embodiment is omitted for brevity of description. In this embodiment, a transmitting device 801 of a semiconductor laser with visible light having a wavelength of 650 to 670 nm and a receiving device 802 of the laser are disposed outside the outer wall forming the process chamber. Laser light 804 transmitted from the transmitting device 801 is introduced into the process chamber through a viewport 803 so as to be obliquely incident on the surface of the target 1. Part of the light irregularly reflected by the surface of the target 1 reaches the receiving device 802 through another viewport 803. An angle 805 of the laser light arriving at the receiving device 802 in this event becomes smaller as the target 1 is located farther from the receiving device 802 due to consumption. Thus, it is possible to measure the distance based on a change in angle of the received light and, specifically, it is possible to perform the measurement with an accuracy of several tens of $\mu m$ at a distance of 1 m ahead. Although the flatness of the surface of the target 1 degrades due to consumption, since the irregular reflection is utilized, part of the laser light infallibly reaches the receiving device 802. In this manner, by using the means for measuring the consumption displacement amount of the target 1 with the laser light and moving the magnet group and the magnetic member group away from the target by a distance equal to the consumption displacement amount, it is possible to perform the long-term operation without changing the film forming rate until the target is substantially all consumed and it is possible to prevent unnecessary thick film formation from being carried out over a long-term period and thus to suppress wasteful use of the material of the target.

Figure 8:
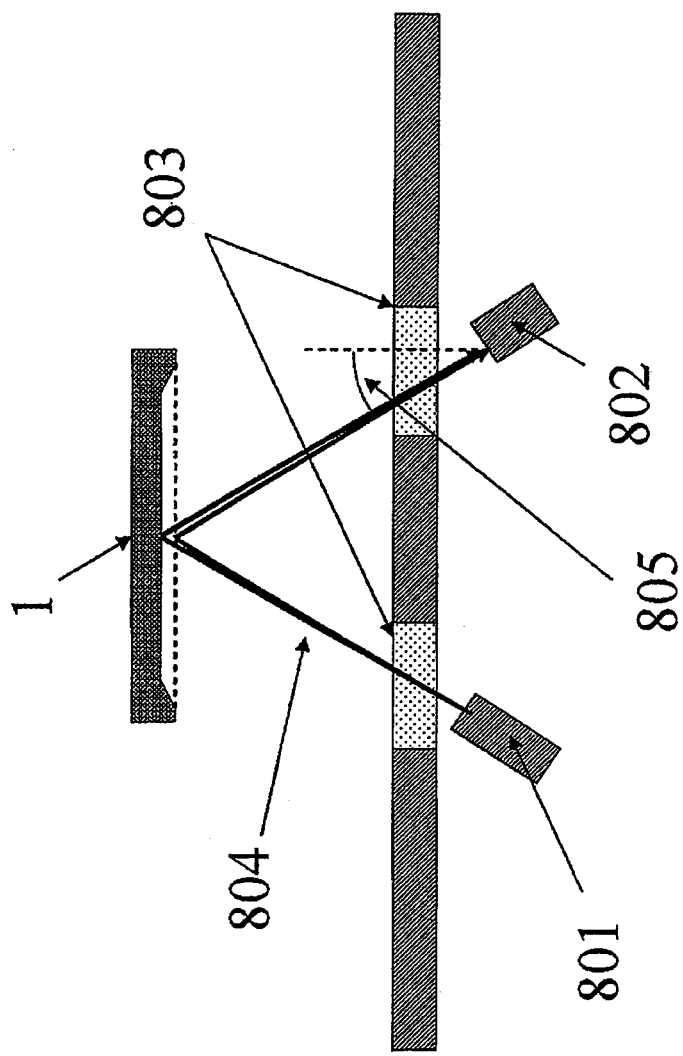
FIG. 8 is a diagram for explaining a rotary magnet sputtering apparatus according to a second embodiment of this invention, wherein there is illustrated a portion for measuring the consumption displacement amount of a target.
Figure 9:
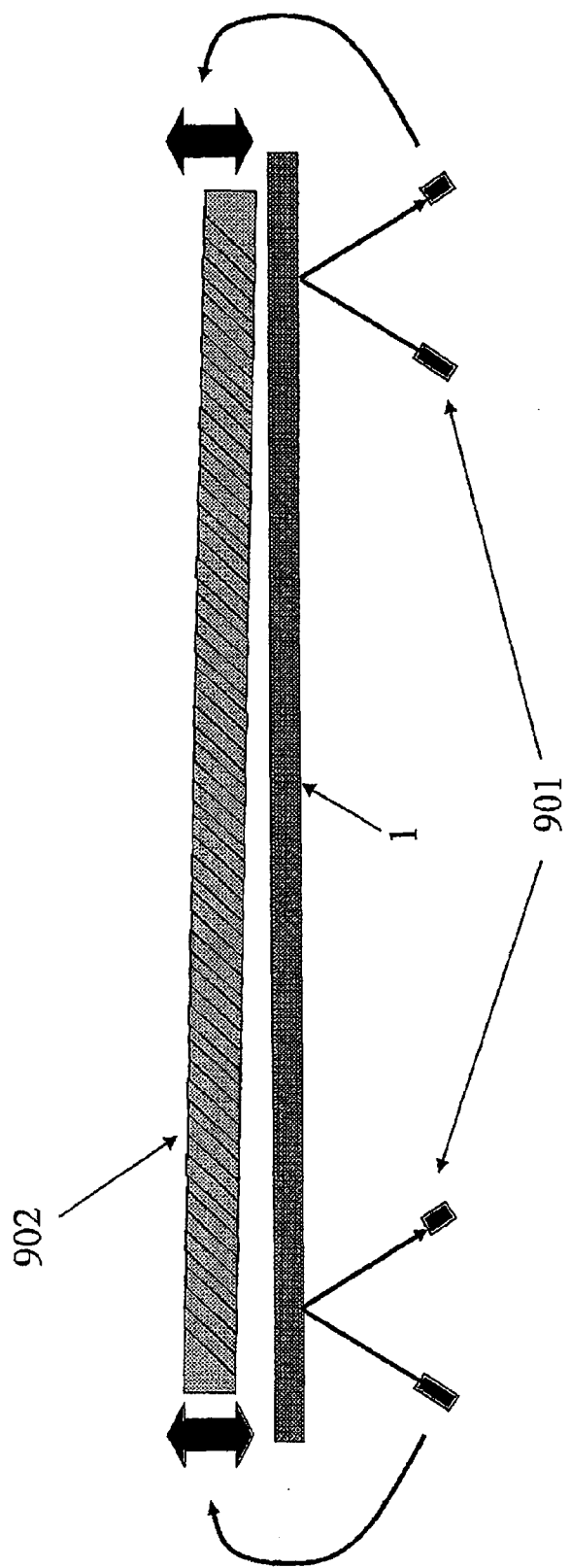
FIG. 9 is a diagram showing a modification of the target consumption displacement amount measuring technique shown in FIG. 8.

In this embodiment, as shown in FIG. 9, it may alternatively be configured that target consumption measuring means 901 each comprising a transmitting portion and a receiving portion of a semiconductor laser, which is the same as that of FIG. 8, are disposed at two positions at both ends in an axial direction of a columnar rotary shaft 902 and the consumption amount of the target 1 is measured by each of the target consumption measuring means 901. In this case, by independently moving both ends of the columnar rotary shaft 902 (and the accompanying magnets and magnetic members) vertically corresponding to the target consumption measuring means 901 at both ends, even if the mounting dimensional accuracy cannot be obtained in a large apparatus, uniform film formation is enabled in the axial direction.

As shown in this example, the consumption amount of the target 1 can be made uniform even with the configuration of moving only the columnar rotary shaft 902 with respect to the target 1, i.e. without the configuration of moving the entire movable portion 21 shown in FIG. 1.

Instead of the transmitting and receiving devices 801 and 802 of the laser, a plurality of (e.g. two) ultrasonic sensors 20 shown in FIG. 1 may be disposed at both ends in the axial direction of the columnar rotary shaft 902.

Third Embodiment

Figure 10:
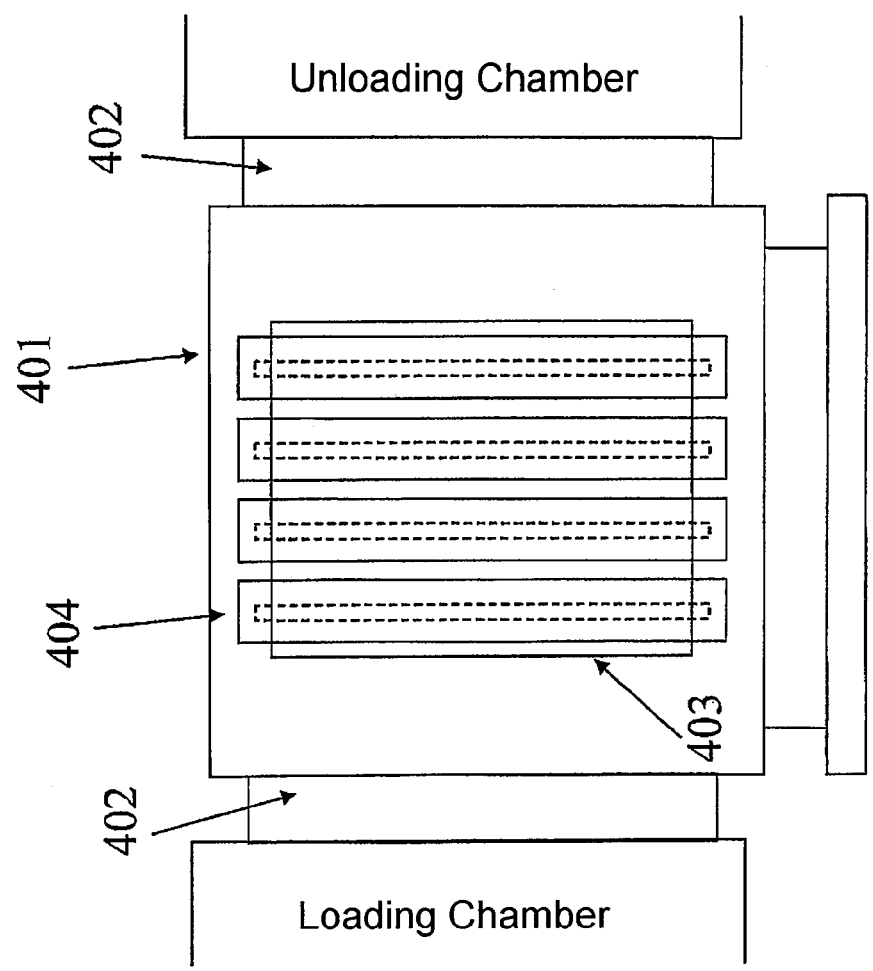
FIG. 10 is a schematic diagram for explaining a rotary magnet sputtering apparatus according to a third embodiment of this invention.
Figure 11:
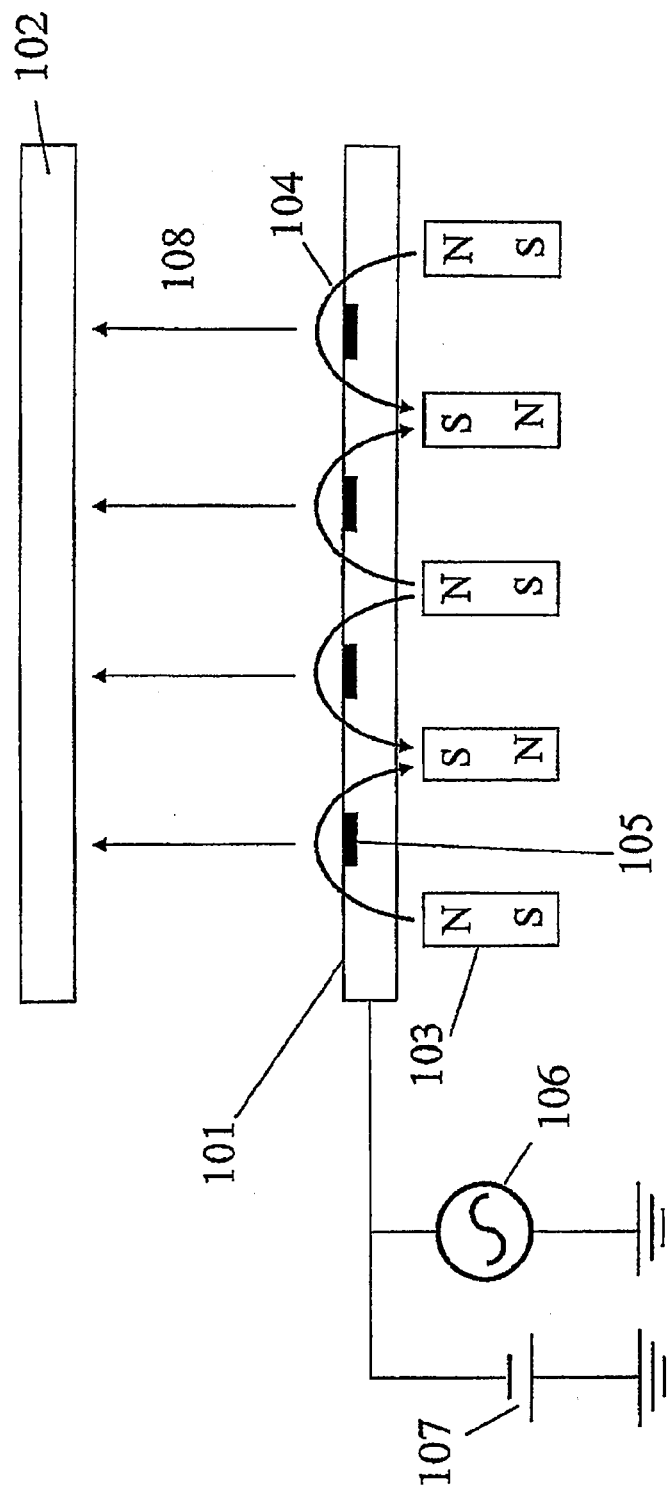
FIG. 11 is a diagram for explaining a conventional magnetron sputtering apparatus.

A third embodiment of this invention will be described in detail with reference to the following drawings. A description of portions overlapping those in the above-mentioned embodiments is omitted for simplification of description. As shown in FIG. 10, a rotary magnet sputtering apparatus according to this invention is particularly suitable when it is used as a reciprocating type film forming apparatus.

In FIG. 10, 401 denotes a process chamber, 402 a gate valve, 403 a substrate, and 404 the rotary magnet plasma excitation portion similar to the first embodiment. The axial length of the helical portion of the magnet is 2700 mm. The frequency of the plasma excitation power is set to 13.56 MHz. In terms of increasing the plasma density and reducing the plasma electron temperature, a high frequency, for example, about 100 MHz is preferable. However, the plasma excitation portion is about 2.7 m while the wavelength of 100 MHz is 3 m. If the length of the excitation portion approximates the wavelength as described above, there is a possibility that a standing wave is excited and makes plasma nonuniform. If the frequency is 13.56 MHz, the wavelength is 22.1 m and thus the length of the plasma excitation portion is sufficiently shorter than the wavelength so that there is no possibility that plasma becomes nonuniform due to the influence of a standing wave.

In this embodiment, four rotary magnet plasma excitation portions 404 are used. This makes it possible to increase the substantial film forming rate. The number of excitation portions is not limited to four. The substrate 403 is a 2.2 m×2.5 m glass substrate. In this embodiment, the substrate is placed with 2.5 m in the length direction and it is configured that the substrate 403 reciprocates in a direction perpendicular to the columnar rotary axis of the rotary magnet plasma excitation portion 404 so that film formation is substantially uniformly enabled on the substrate 403. For uniform film formation, the substrate 403 may be set not to reciprocate but to pass in one direction or use may be made of a method of moving the rotary magnet plasma excitation portion 404.

In this embodiment, by reciprocating the substrate 403, it is possible to continuously expose part of the substrate 403 to a plasma region excited by the rotary magnet plasma excitation portion 404, thereby uniformly forming a thin film. By setting the rotational speed of the rotary magnets so that the time for one rotation is faster than the passing time of the substrate 403, it is possible to achieve uniform film formation not affected by moment-to-moment erosion patterns. Typically, the passing speed of the substrate 403 is 60 seconds per substrate and the rotational speed of the rotary magnets is 10 Hz. Although the substrate is reciprocated in this embodiment, the apparatus may alternatively be formed as a passing film formation type apparatus in which a substrate is caused to pass through one or a plurality of rotary magnet plasma excitation portions 404 only once.

In each of the illustrated rotary magnet plasma excitation portions 404, like in FIG. 1, an ultrasonic sensor is provided so that it is possible to measure the consumption displacement amount of the target, and the magnet group and the magnetic member group are configured to be vertically movable corresponding thereto. By using such a means for measuring the consumption displacement amount of the target and moving the magnet group and the magnetic member group away from the target by a distance equal to the consumption displacement amount, it is possible to perform the long-term operation without changing the film forming rate until the target is substantially all consumed and it is possible to prevent unnecessary thick film formation from being carried out over a long-term period and thus to suppress wasteful use of the material of the target.

While this invention has been described in connection with the embodiments, the magnet sizes, the substrate sizes, and the like are not limited to the embodiments.

In the above-mentioned embodiments, the description has been given about the case where the laser light or the ultrasonic wave is used as the means for measuring the consumption displacement amount of the target. Alternatively, an electromagnetic wave such as a millimeter wave, a submillimeter wave, a terahertz wave, or an infrared ray may be used as a measuring means.

INDUSTRIAL APPLICABILITY

A rotary magnet sputtering apparatus according to this invention can be not only used for forming an insulating film or a conductive film on a semiconductor wafer or the like, but also applied for forming various films on a substrate such as a glass substrate of a flat display device, and can be used for sputtering film formation in the manufacture of storage devices or other electronic devices.

The invention claimed is:

1. A rotary magnet sputtering apparatus comprising a substrate holder for holding a substrate to be processed, a target facing said substrate holder, and a magnet disposed on a back side of said target relative to said substrate holder, and adapted to confine plasma on a target surface by forming a magnetic field on the target surface using said magnet, wherein:

said magnet comprises a rotary magnet group having a plurality of plate-like magnets arranged on a surface of a columnar rotary shaft of a polygonal shape in cross-section, the columnar rotary shaft being extended in parallel with the target surface so that the plurality of the plate-like magnets form a plurality of helices around the surface of the columnar rotary shaft, the plate-like magnets included in one of the plurality of helices having the same magnetic pole that is directed towards surfaces of the plate-like magnets of the one of the helices and that is different from that of the plate-like magnets included in adjacent ones of the helices;

the magnet further comprising a fixed outer circumferential frame magnet which is arranged in parallel with the target surface around said rotary magnet group and which is magnetized in a direction perpendicular to the target surface;

a magnetic field pattern on the target surface moves with time by rotating said rotary magnet group along with said columnar rotary shaft parallel with the target surface, and said rotary magnet sputtering apparatus comprises means for measuring a consumption amount of said target, and has a function of moving said columnar rotary shaft, said rotary magnet group, and said fixed outer circumferential frame magnet away from said target by a distance equal to said consumption displacement amount, thereby always maintaining constant a distance between the target surface and each of said columnar rotary shaft, said rotary magnet group, and said fixed outer circumferential frame magnet.

2. A rotary magnet sputtering apparatus according to claim 1, wherein said means for measuring the consumption displacement amount of said target comprises an ultrasonic transducer attached to the back side of said target to perform the measurement on the basis of a reflection property of ultrasonic radiation.

3. A rotary magnet sputtering apparatus according to claim 1, wherein said means for measuring the consumption displacement amount of said target performs the measurement by entering light from a fixed position on a side of said target, faced towards said substrate holder, and by measuring an amount of change in angle of reflected light at another fixed position.

4. A rotary magnet sputtering apparatus according to claim 1, wherein said means for measuring the consumption displacement amount of said target comprises a plurality of measurement units arranged in an axial direction of said columnar rotary shaft to measure the consumption displacement amount.

5. A rotary magnet sputtering apparatus according to claim 1, wherein at least part of said columnar rotary shaft is a paramagnetic substance.

6. A rotary magnet sputtering apparatus according to claim 1, wherein a fixed outer peripheral paramagnetic member is disposed adjacent to said fixed outer circumferential frame magnet on an opposite side of said fixed outer circumferential frame magnet relative to said target.

7. A rotary magnet sputtering apparatus according to claim 1, further comprising means for weakening magnetic flux directed toward an outer side of said target from said fixed outer circumferential frame magnet in comparison with magnetic flux directed toward an inner side of said target from said fixed outer circumferential frame magnet.

8. A rotary magnet sputtering apparatus according to claim 7, wherein said means comprises a paramagnetic member arranged to continuously cover, among surfaces of said fixed outer circumferential frame magnet, the side surface on an outer side as seen from the target side and part of the surface on the target side.

9. A rotary magnet sputtering apparatus according to claim 7, wherein said means is configured by said fixed outer circumferential frame magnet such that, among surfaces of said fixed outer circumferential frame magnet, the surface on the target side is projected toward the inner side of said target.

10. A rotary magnet sputtering apparatus according to claim 1, wherein a shielding member extends in a direction the same as the axial direction of said columnar rotary shaft and forms a slit opening said target to said substrate and a width and a length of said slit are set so that, when said rotary magnet group is rotated at a constant frequency, a region is opened as seen from said substrate, such that a magnetic field strength is 75% or more of a maximum value in a time average distribution of magnetic field strengths of components parallel to the target surface in a magnetic field formed on the target surface.

11. A rotary magnet sputtering apparatus according to claim 1, further comprising a shielding member disposed on a side opposite to said rotary magnet group so as to cover an end portion of said target and to be spaced apart from said target; said shielding member being electrically grounded, and extending in a direction the same as the axial direction of said columnar rotary shaft and forming therealong a slit opening said target to said substrate and a width and a length of said slit are set so that, when said substrate is fixed and said plate-like magnet group is rotated at a constant frequency, a region of said substrate is shielded such that a film thickness to be formed per unit time is 80% or less of a maximum film thickness to be formed on said substrate per unit time when the end portion of said target is not shielded.

12. A rotary magnet sputtering apparatus according to claim 1, wherein said rotary magnet group and said fixed outer circumferential frame magnet are movable in the direction perpendicular to the target surface.

13. A rotary magnet sputtering apparatus according to claim 1, wherein said rotary magnet group and said fixed outer circumferential frame magnet are disposed in a space surrounded by said target member, a backing plate to which said target member is bonded, and a wall surface continuously extended from the periphery of said backing plate and said space can be reduced in pressure.

14. A rotary magnet sputtering apparatus according to claim 1, comprising means for relatively moving said substrate in a direction crossing the axial direction of said columnar rotary shaft.

15. A rotary magnet sputtering apparatus comprising a plurality of rotary magnet sputtering apparatuses each of which is formed in accordance with claim 1 and which are disposed in parallel with the axial direction of said columnar rotary shaft, wherein there is provided means for relatively moving said substrate in a direction crossing the axial direction of said columnar rotary shaft.

16. A method of sputtering using the rotary magnet sputtering apparatus according to claim 1 comprising:
performing film deposition of a material of said target on a substrate to be processed while rotating said columnar rotary shaft.

17. An electronic device manufacturing method comprising a step of performing sputtering film formation on a substrate to be processed, using the sputtering method according to claim 16.

* * * * *